United States Patent
Chen et al.

(10) Patent No.: US 9,466,522 B2
(45) Date of Patent: Oct. 11, 2016

(54) METHOD FOR FABRICATING SEMICONDUCTOR STRUCTURE

(71) Applicant: Powerchip Technology Corporation, Hsinchu (TW)

(72) Inventors: Jian-Lin Chen, Kaohsiung (TW); Ta-Chien Chiu, Miaoli County (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/656,605

(22) Filed: Mar. 12, 2015

(65) Prior Publication Data

US 2016/0211175 A1    Jul. 21, 2016

(30) Foreign Application Priority Data

Jan. 15, 2015 (TW) .............................. 104101332 A

(51) Int. Cl.
| | |
|---|---|
| *H01L 21/4763* | (2006.01) |
| *H01L 21/768* | (2006.01) |
| *H01L 21/311* | (2006.01) |
| *H01L 21/3213* | (2006.01) |

(52) U.S. Cl.
CPC .... *H01L 21/76816* (2013.01); *H01L 21/31111* (2013.01); *H01L 21/31144* (2013.01); *H01L 21/32133* (2013.01); *H01L 21/32139* (2013.01); *H01L 21/76814* (2013.01)

(58) Field of Classification Search
CPC ................... H01L 21/76816; H01L 21/31111; H01L 21/31144; H01L 21/32133
See application file for complete search history.

(56) References Cited

U.S. PATENT DOCUMENTS

| | | |
|---|---|---|
| 8,530,350 B2 | 9/2013 | Freeman et al. |
| 8,592,890 B2 * | 11/2013 | Watanabe ......... H01L 27/11578 257/314 |
| 8,704,288 B2 | 4/2014 | Lee et al. |
| 2009/0097309 A1 * | 4/2009 | Mizukami ................ G11C 5/02 365/184 |
| 2012/0149201 A1 | 6/2012 | Fu et al. |
| 2012/0187471 A1 * | 7/2012 | Yu ..................... H01L 27/11582 257/324 |
| 2014/0038400 A1 | 2/2014 | Park et al. |

* cited by examiner

*Primary Examiner* — Bradley K Smith
(74) *Attorney, Agent, or Firm* — Jianq Chyun IP Office

(57) ABSTRACT

A method for fabricating semiconductor structure is provided. A substrate having a plurality of blocks is provided. Each of the blocks includes a first region and a second region. The first region and the second region are disposed alternately. A plurality of composite layers is formed on the substrate. The top-most layer of the composite layers is patterned. A plurality of composite blocks is formed on the first region of the substrate. The composite layers and the composite blocks on the blocks are removed successively by a removal process. A staircase structure is formed on the substrate.

13 Claims, 13 Drawing Sheets

METHOD FOR FABRICATING SEMICONDUCTOR STRUCTURE

CROSS-REFERENCE TO RELATED APPLICATION

This application claims the priority benefit of Taiwan application serial no. 104101332, filed on Jan. 15, 2015. The entirety of the above-mentioned patent application is hereby incorporated by reference herein and made a part of this specification.

BACKGROUND OF THE INVENTION

1. Field of the Invention

The invention generally relates to a method for fabricating a semiconductor structure, and more particularly, to a method for fabricating a semiconductor structure with a staircase structure.

2. Description of Related Art

Following the integration of semiconductor devices, in order to achieve high density and high performance, developments towards three-dimensional space have become the trend under the condition of having a limited unit area. Using a non-volatile memory as an example, it includes a vertical memory array formed by a plurality of memory cells. Even though the three-dimensional semiconductor device enables memory capacity per unit area to increase, but also raises the difficulty for elements in different layers to connect with each other.

In recent year, pad with a staircase structure have been developed in the three-dimensional semiconductor device. The pad can enable the elements located at each layer to be easily connected with the other elements. However, defining a staircase, for example, requires to undergo one time of a lithography and etching process. As the layer of the three-dimensional semiconductor device increases, defining a plurality of staircases then requires to undergo multiple times of the lithography and etching process, thus not only increasing the production costs but also seriously affect the productivity. Therefore, how to simplify the fabrication process of the staircase structure in the three-dimensional semiconductor device, so as to lower the production costs, is a current topic that needs to be researched.

SUMMARY OF THE INVENTION

The invention is directed to a method for fabricating a semiconductor structure, which is capable of greatly simplifying the number of photomask and the steps of fabrication process being required.

The invention provides a method for fabricating a semiconductor structure including the following steps. A substrate including a plurality of blocks is provided. Each of the blocks respectively includes a first region and a second region, and the first regions and the second regions are disposed alternately. A plurality of composite layers is formed on the substrate. The top-most layer of the composite layers is patterned, so as to form a plurality of composite blocks on the first regions of the substrate. The composite layers and the composite blocks on the blocks are successively removed by a removal process, so as to form a staircase structure on the substrate.

In one embodiment of the invention, the method for successively removing the composite layers and the composite blocks on the blocks by the removal process includes the following steps. A photoresist layer is formed on the substrate, and the photoresist layer covers the composite layers and the composite blocks on one block. The composite layers and the composite blocks not covered by the photoresist layer are removed, so as to form the staircase structure on the substrate.

In one embodiment of the invention, the method for fabricating the semiconductor structure further includes the following steps. The removal process is repeated, wherein for each repetition of the removal process, the photoresist layer further covers the composite layers on one more block.

In one embodiment of the invention, the composite layers are N layers, and the number of times of performing the removal process is $N/2-1$, wherein $N \geq 2$ and N is an even number.

In one embodiment of the invention, the composite layers are N layers, and the number of times of performing the removal process is $(N+1)/2-1$, wherein $N \geq 2$ and N is an odd number.

In one embodiment of the invention, the number of the composite layers covered by the photoresist layer is two more than the number of the composite layers that are previously covered by the photoresist layer.

In one embodiment of the invention, the method for removing the composite layers not covered by the photoresist layer includes simultaneously removing two of the composite layers.

In one embodiment of the invention, the method for removing the composite layers and the composite blocks not covered by the photoresist layer includes simultaneously removing each of the composite blocks and the composite layer located under each of the composite blocks.

In one embodiment of the invention, the method for removing the composite layers and the composite blocks not covered by the photoresist layer includes the following steps. A mask layer is formed on the composite layers of the first regions. Parts of the top-most layer of the composite layers not covered by the mask layer are removed. The mask layer is removed, so as to form the composite blocks on the first regions of the substrate.

In one embodiment of the invention, the composite layers are N layers, and the number of photomask required for performing the removal process is at least $N/2-1$, wherein $N \geq 2$ and N is an even number.

In one embodiment of the invention, the composite layers are N layers, and the number of photomask required for performing the removal process is at least $(N+1)/2-1$, wherein $N \geq 2$ and N is an odd number.

In one embodiment of the invention, the composite layers include a conductor layer, a semiconductor layer, a dielectric layer, or a combination thereof.

In one embodiment of the invention, each of the composite layers includes a conductor layer and a dielectric layer, and the conductor layers in two adjacent composite layers are electrically isolated by the dielectric layer.

In one embodiment of the invention, the staircase structure includes a plurality of exposed surfaces, and each of the exposed surfaces exposes a part of the dielectric layer.

In one embodiment of the invention, the staircase structure includes a plurality of stairs, and a width of each of the stairs is equal to a width of each of the first regions of the substrate.

In view of the foregoing, in the method for fabricating the semiconductor structure of the invention, a pattern of the mask layer is transferred to the top-most layer of composite layers by pre-patterning the top-most layer of the composite layers. Then, in a subsequently performed lithography and etching process, the staircase structure is formed in a manner of using one photomask in combination with the etching of two composite layers. Consequently, as compared to the conventional fabrication process, when fabricating same layers of staircase structure, the number of times being required to perform the lithography and etching process of the invention is only half of the number of the layers, thereby greatly simplifying the fabrication process of the staircase structure, and thus the goals of lowering the manufacturing costs and enhancing the productivity are achieved.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1M are cross-sectional diagrams illustrating fabrication flows of a semiconductor structure according to an embodiment of the invention.

Figure 1A:
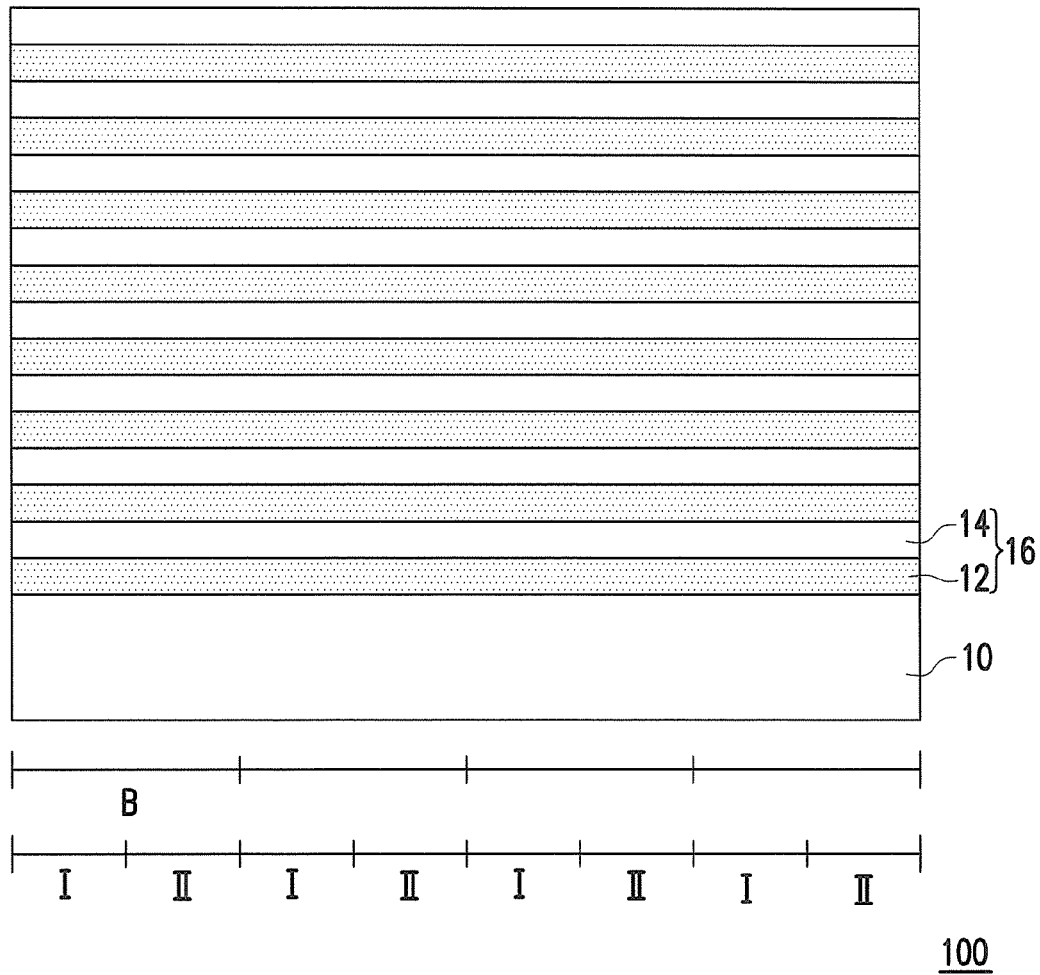
FIG. 1A to FIG. 1M are cross-sectional diagrams illustrating fabrication flows of a semiconductor structure according to an embodiment of the invention.

Referring to FIG. 1A, a substrate 10 is provided. The substrate 10 is, for example, a silicon substrate or a doped polysilicon. The substrate 10 can, for example, be divided into a plurality of blocks B, each of the blocks B respectively includes a first region I and a second region II, and the first regions I and the second regions II are disposed alternately. That is, the substrate 10 includes a plurality of first region I and a plurality of second region II that are alternately arranged each other.

Afterward, a plurality of composite layers 16 are formed on the substrate 10. The method for forming the composite layers 16 is, for example, chemical vapor deposition. The composite layers 16, for example, include two or more than two material layers 12 and 14. The material layers 12 and 14 may include a conductor layer, a semiconductor layer, a dielectric layer or a combination thereof. In one embodiment, the composite layers 16, for example, includes a conductor layer and a dielectric layer, and the conductor layers in two adjacent composite layers 16 may be electrically isolated by the dielectric layer. In another embodiment, the composite layers 16 may include two dielectric layers, such as a nitride layer and an oxide layer, but the invention is not limited thereto. The number of the composite layers 16 is, for example, N, wherein N≥2, and N may be an odd number or an even number. For instance, the number of the composite layers 16 may be four layers, eight layers or even more layers. In FIG. 1A, for the purpose of illustration, the composite layers 16 are drawn as eight layers, but the invention is not limited thereto. A person skilled in the art can self-adjust the number of the composite layers 16 according to the practical needs.

Figure 1B:
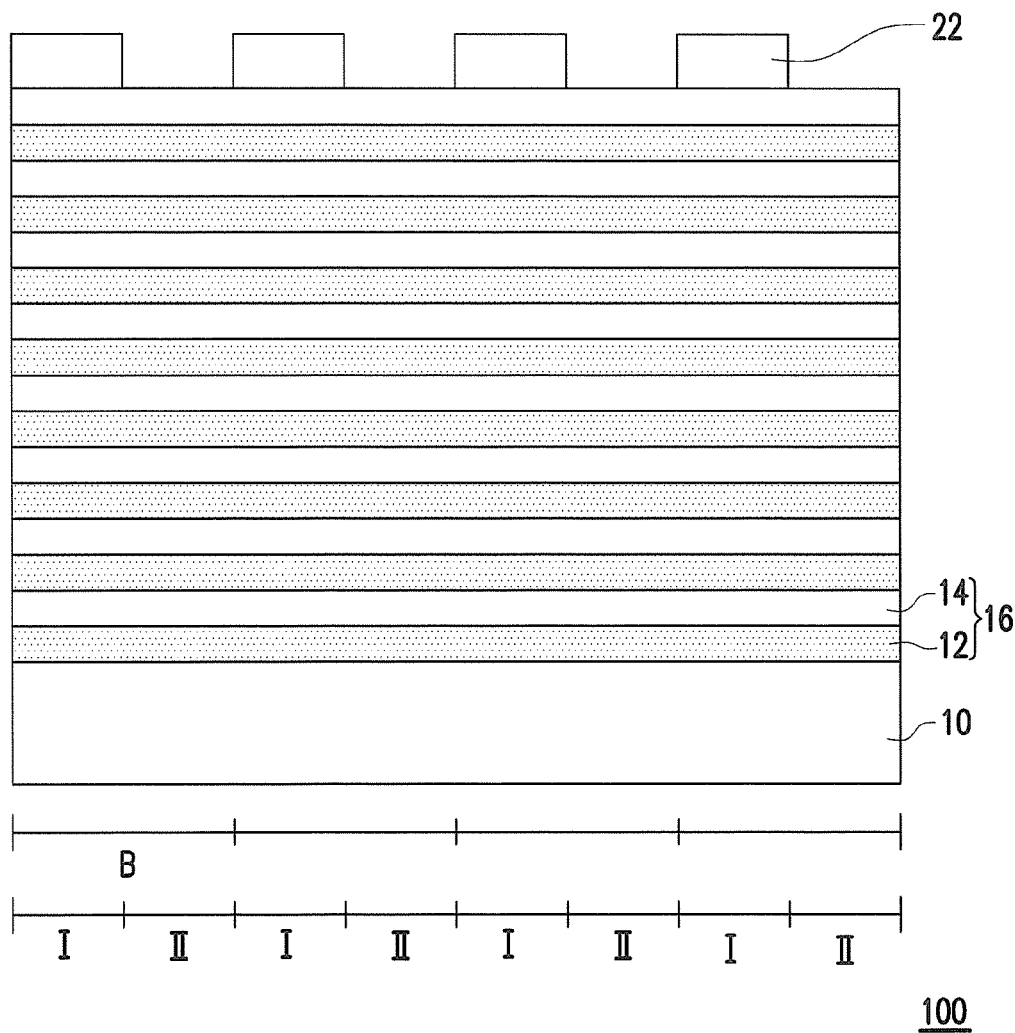

Referring to FIG. 1B, next, a mask layer 22 is formed on the first regions I of the composite layers 16 of the substrate 10. A material of the mask layer 22 is, for example, photoresist material.

Figure 1C:
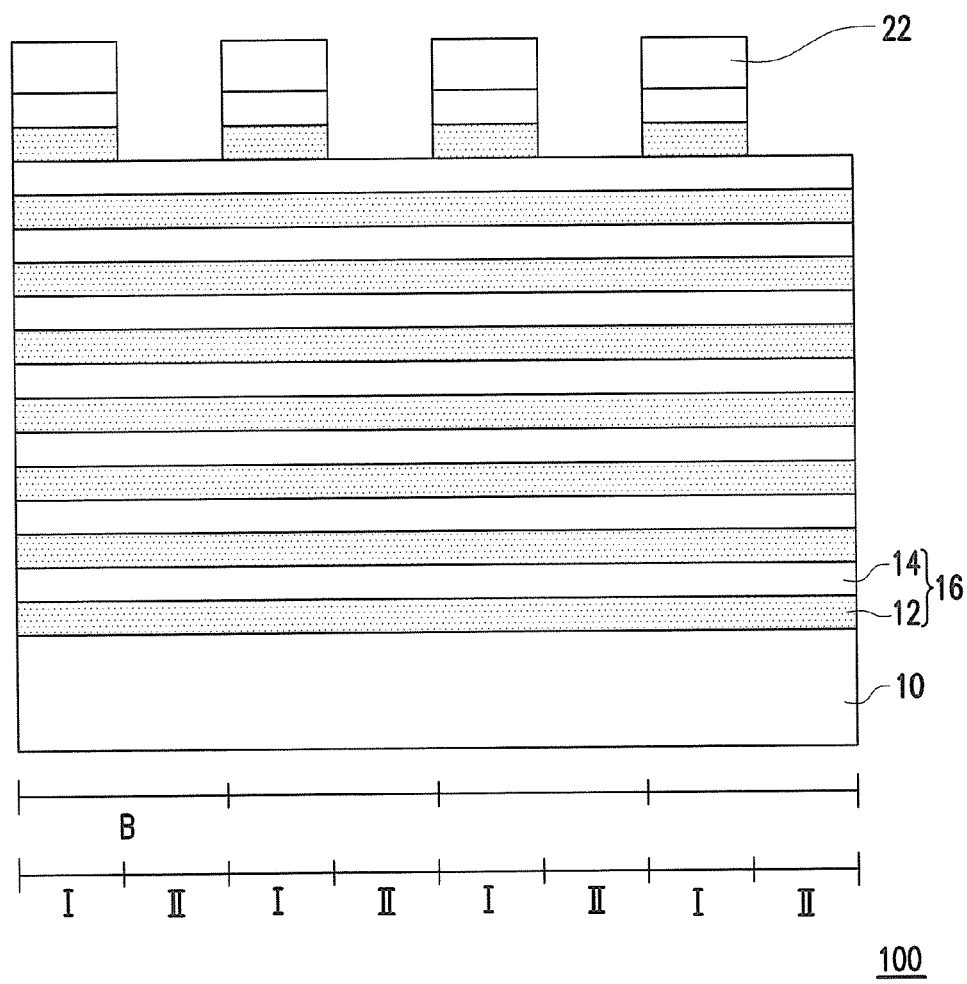
Figure 1D:
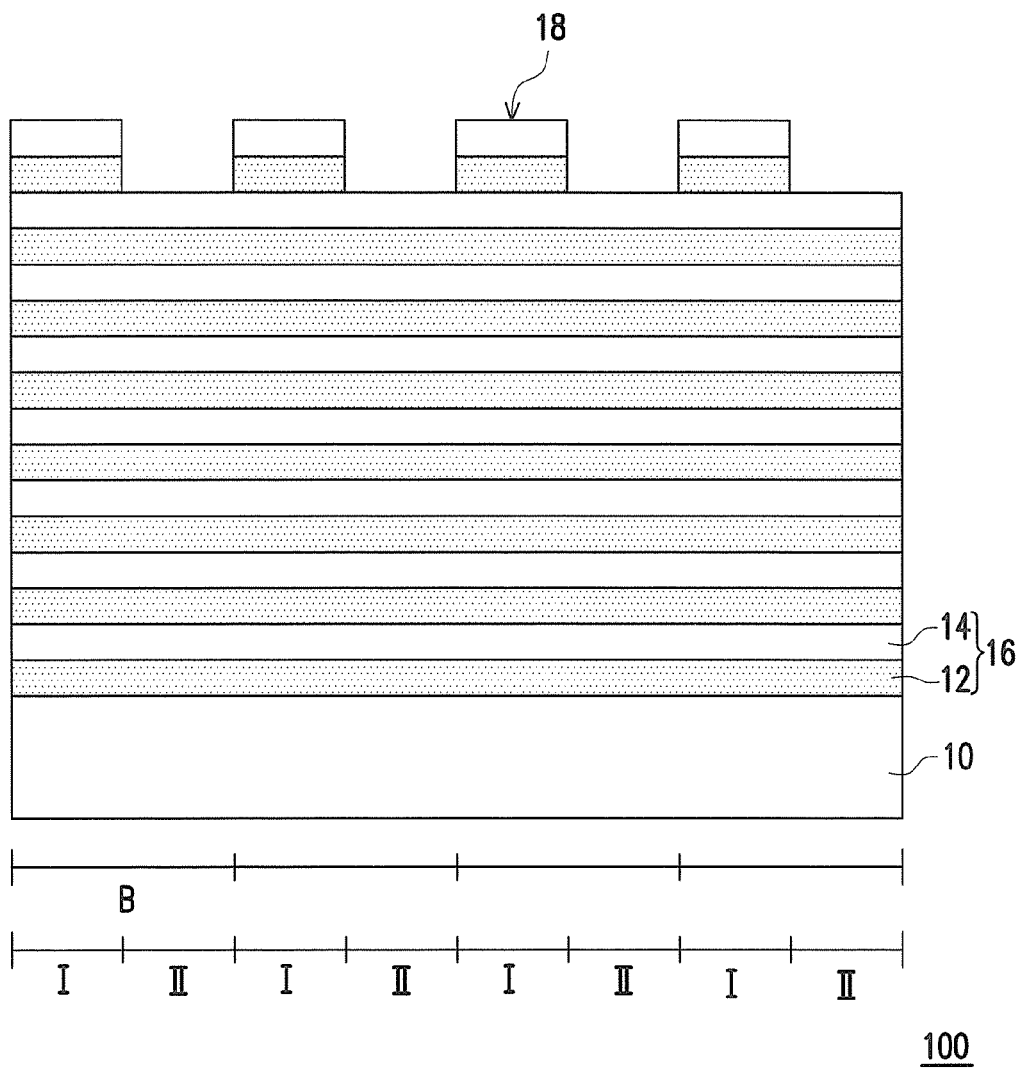

Referring to FIG. 1C and FIG. 1D, by using the mask layer 22 as a mask, parts of the top-most layer of the composite layers 16 not covered by the mask layer 22 (e.g., the top-most layer of the composite layers 16 located on the second regions II) are removed, and the top-most layer of the composite layers 16 is patterned. The method for removing parts of the top-most layer of the composite layers 16 includes performing an etching process to the substrate 10. Afterword, the mask layer 22 is removed, so as to form a plurality of composite blocks 18, respectively, on the first regions I of the substrate 10.

Figure 1E:
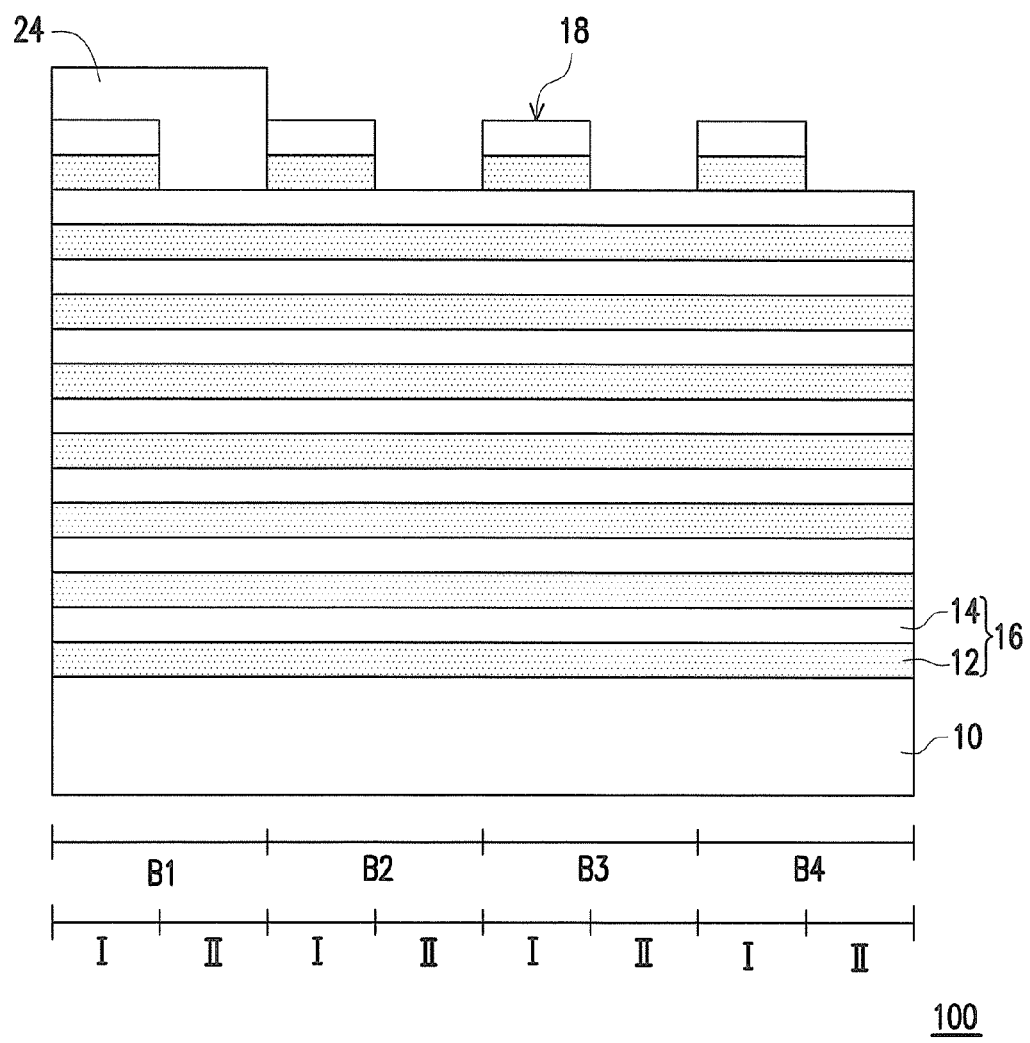
Figure 1F:
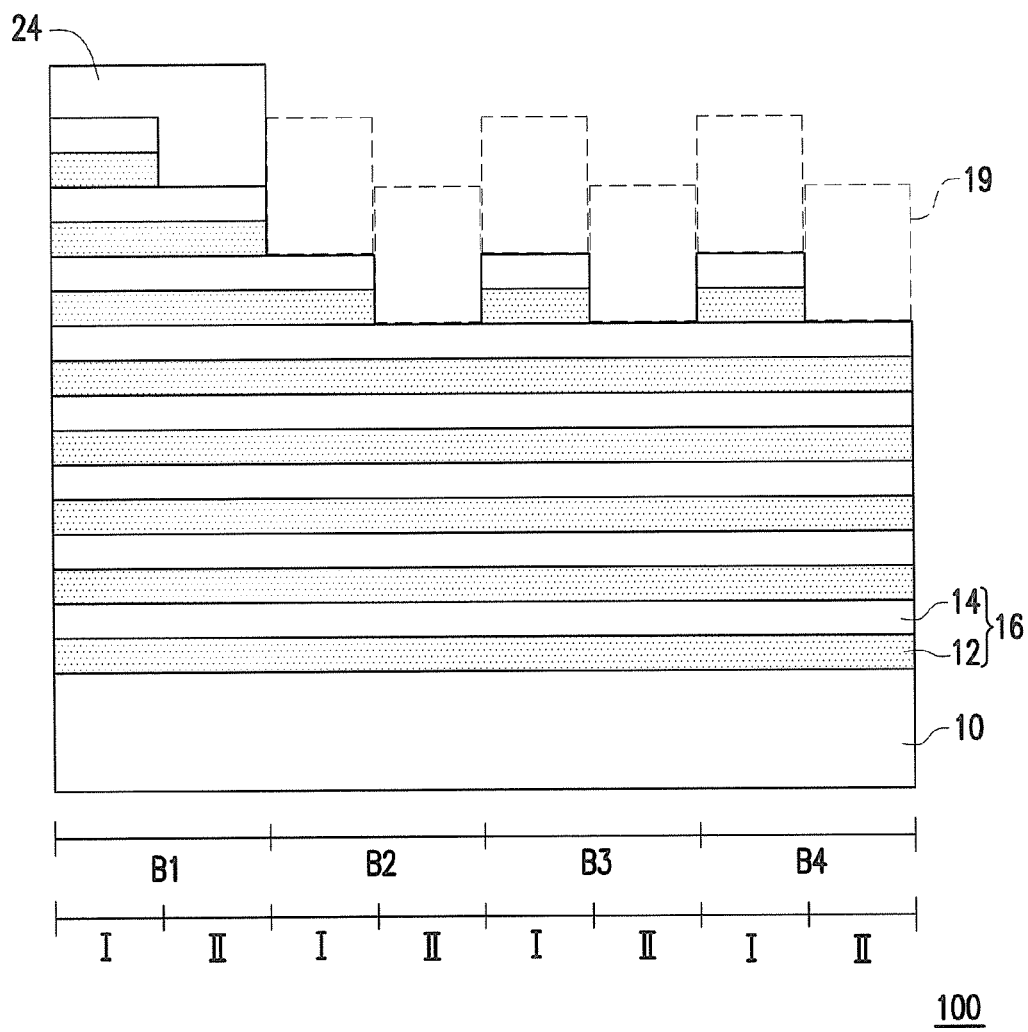

Referring to FIG. 1E and FIG. 1F, next, a removal process is successively performed to the composite layers 16 and the composite blocks 18 on the blocks B. The method for performing the removal process includes following steps. A photoresist layer 24 is formed on the block B1 of the substrate 10. The photoresist layer 24 covers the composite layers 16 and the composite block 18 located on the block B1. Then, an etching process is performed to the substrate 10, so as to remove parts of the composite layers 16 and the composite blocks 18 not covered by the photoresist layer 24 (e.g., parts of the composite layers 16 and the composite blocks 18 located on the blocks B2, B3 and B4; namely, removing parts 19). The etching process, for example, is a dry etching process. The method for removing parts of the composite layers 16 and the composite blocks 18 not covered by the photoresist layer 24, for example, includes simultaneously removing the composite blocks 18 not covered by the photoresist layer 24 and also parts of the composite layers 16 located under the composite blocks 18. In one embodiment, the method for removing parts of the composite layers 16 not covered by the photoresist layer 24 includes simultaneously removing two composite layers 16, but the invention is not limited thereto.

Figure 1G:
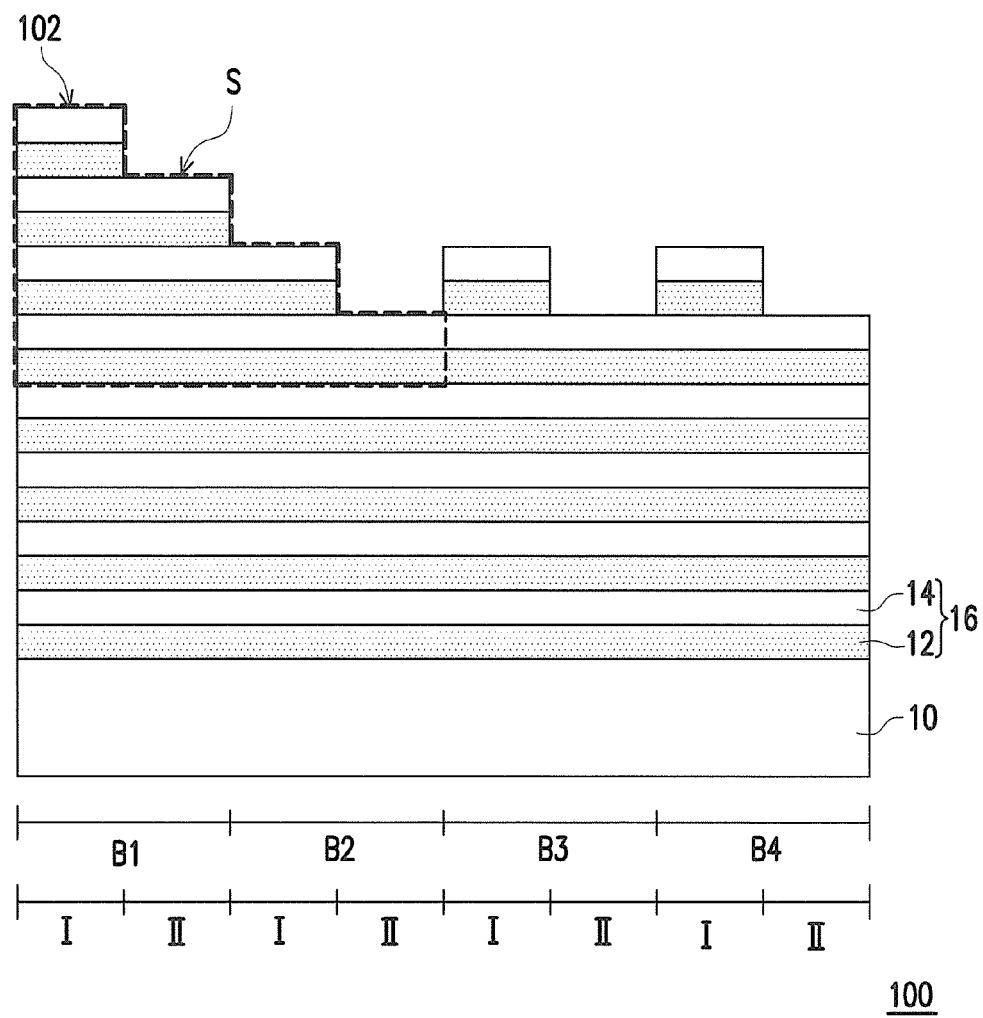

Referring to FIG. 1G, the photoresist layer 24 is removed, so as to form a staircase structure 102 on the substrate 10. The staircase structure 102 includes a plurality of stairs. The staircase structure 102 in FIG. 1G, for example, includes four stairs, but the invention is not limited thereto. In one embodiment, a width of each of the stairs is, for example, equal to a width of the first region I of the substrate 10. Otherwise, the width of each of the stairs is, for example, equal to a width of the composite block 18. In addition, the staircase structure 102, for example, includes a plurality of exposed surfaces S. In one embodiment, each of the exposed surfaces S exposes parts of the material 14 (e.g., the dielectric layer).

It is to be noted that, when the number of the composite layers 16 is four, a staircase structure 102 with four stairs may also be formed through using the aforesaid fabrication method (such as pattering the top-most layer of the composite layers 16 and performing one removal process). That is, the four composite layers 16 are being performed with two times of lithography and etching process, so as to form the staircase structure 102 with four stairs. Namely, when the number of the composite layers 16 is N and N is an even number, the number of times being required to perform the lithography and etching process for forming a staircase structure with N stairs is at least N/2 times. Herein, the number of photomask being required is at least N/2; and when N is an odd number, the number of times being required to perform the lithography and etching process for forming the staircase structure with N stairs is at least (N+1)/2 times. Herein, the number of photomask being required is at least (N+1)/2.

The aforesaid method for fabricating the semiconductor structure 100 includes forming the staircase structure 102 with four stairs. However, the number of the stairs is only provided as an example, and the invention is not limited thereto. In other embodiments of the invention, the method for fabricating the semiconductor structure 100 may include forming a staircase structure with eight stairs or even more stairs.

It is to be noted that, the method for forming the staircase structure with even more stairs includes repeating the aforesaid removal process. In one embodiment, for each repetition of the removal process, the photoresist layer, for example, further covers the composite layers on one more block. For instance, in each removal process, the number of the composite layers covered by the photoresist layer is two more than the number of the composite layers covered by the photoresist layer during the prior removal process, but the invention is not limited thereto. Moreover, in the present embodiment, when the number of the composite layers is N and N is an even number, the number of times of performing the removal process is, for example, N/2−1 times. In other words, the number of photomask being required for performing the removal process is at least N/2−1. Moreover, when N is an odd number, the number of times of performing the removal process is, for example, (N+1)/2−1. In other words, the number of photomask being required for performing the removal process is at least (N+1)/2−1. The method for forming the staircase structure with even more stairs is described in the following steps.

Figure 1H:
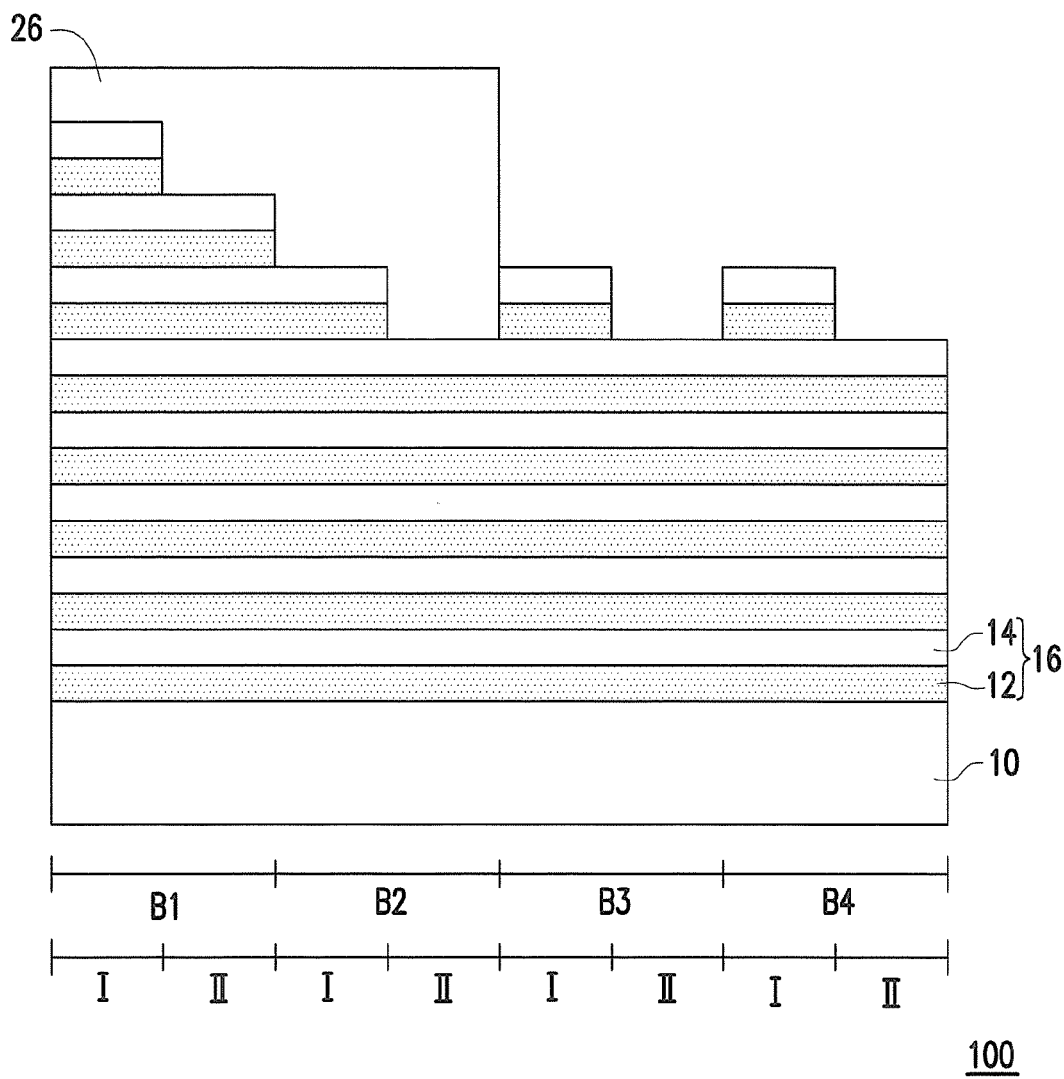
Figure 1I:
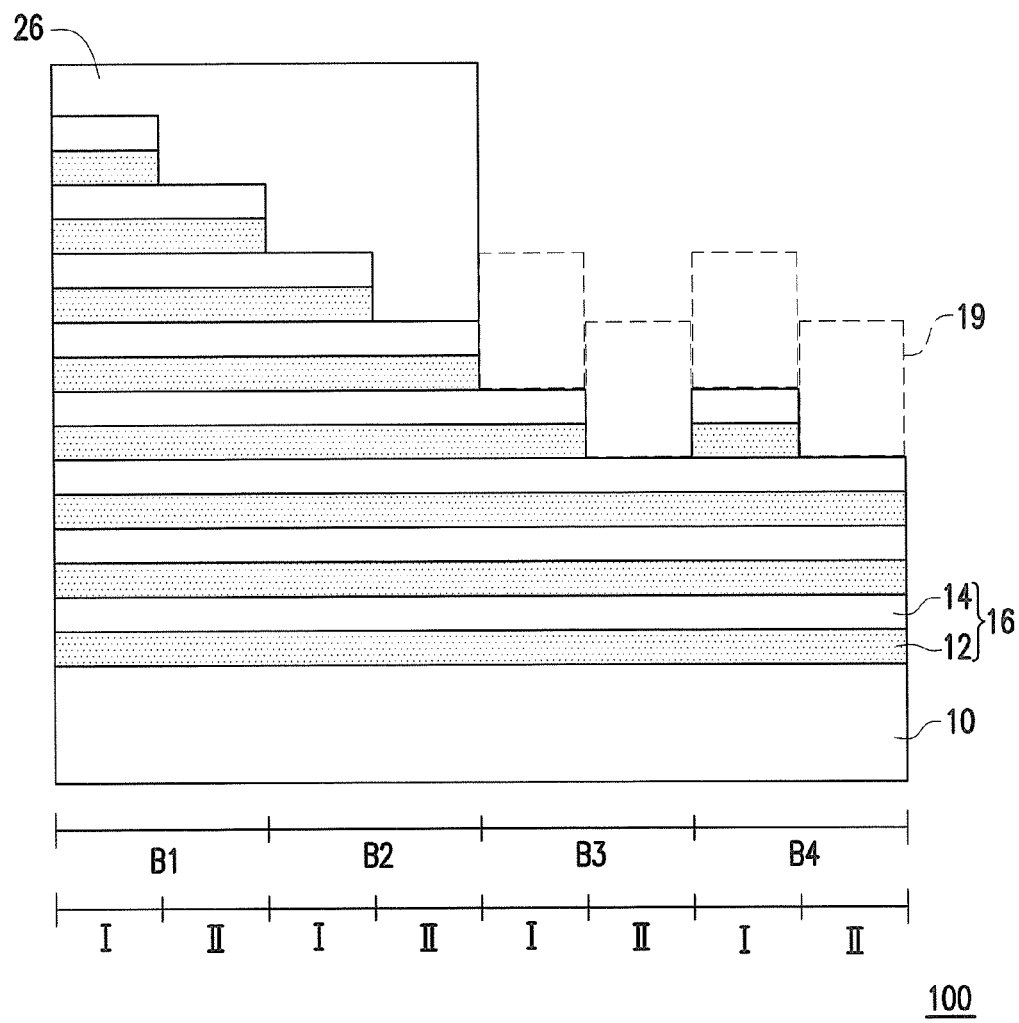

Referring to FIG. 1H and FIG. 1I, a photoresist layer 26 is formed on the staircase structure 102. In the present embodiment, the photoresist layer 26, for example, covers the composite layers 16 located on the blocks B1 and B2. And, the number of the composite layers 16 covered by the photoresist layer 26 is, for example, two more than the number of the composite layers 16 covered by the photoresist layer 24 in FIG. 1E. Then, parts of the composite layers 16 not covered by the photoresist layer 26 are removed. The removing method includes the dry etching method. In one embodiment, the method for removing the parts of the composite layers 16 not covered by the photoresist layer 26 includes simultaneously removing two composite layers 16 (namely, the parts 19).

Figure 1J:
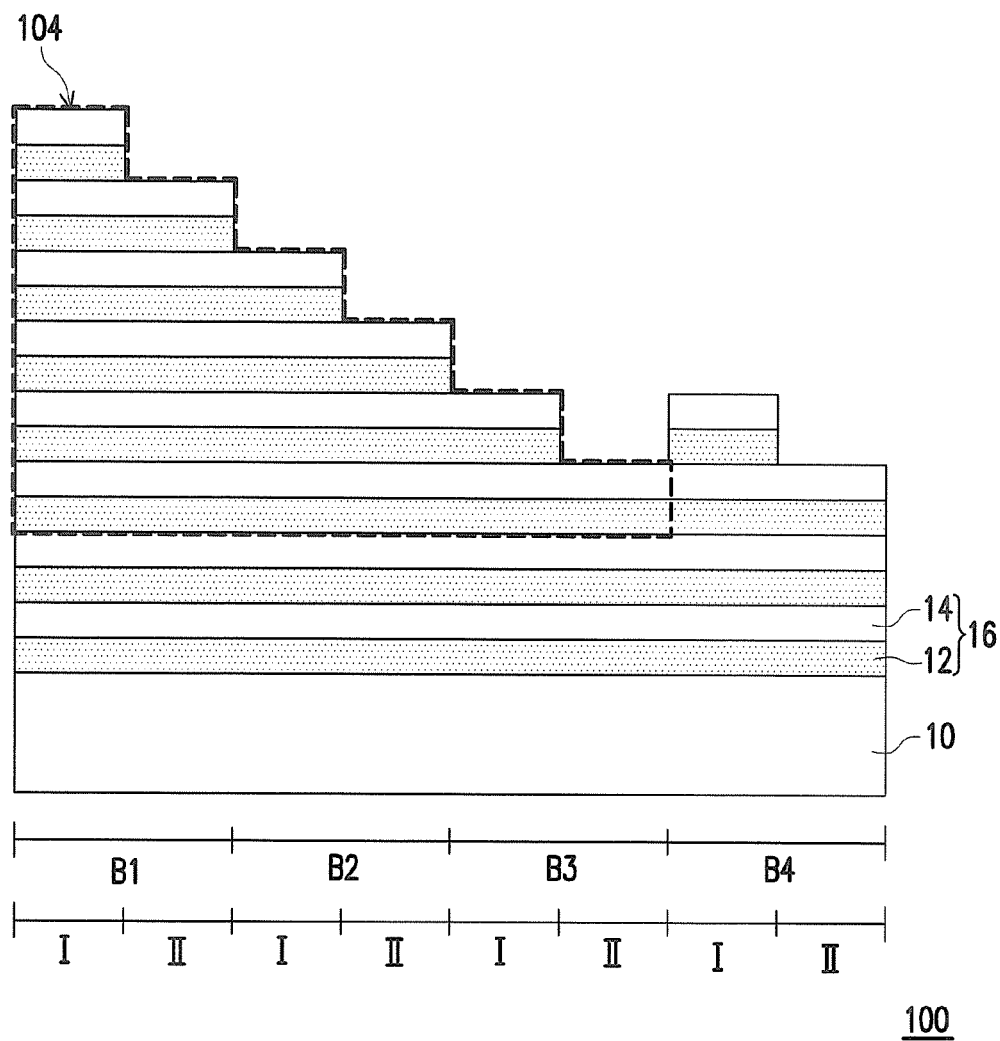

Referring to FIG. 1J, the photoresist layer 26 is removed, so as to form a staircase structure 104 on the substrate 10. The second staircase structure 104, for example, includes six stairs, but the invention is not limited thereto. In one embodiment, the number of the stairs in the staircase structure 104 is two more than that of the staircase structure 102.

Figure 1K:
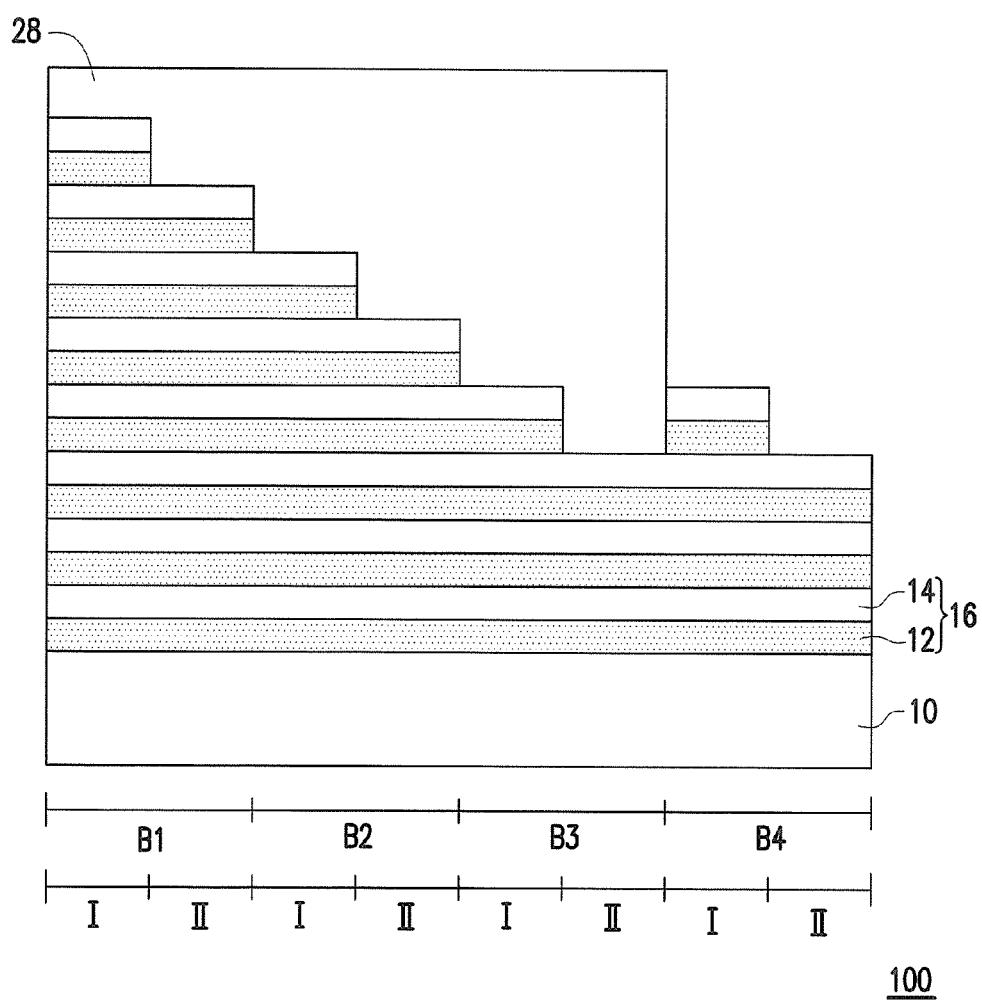
Figure 1L:
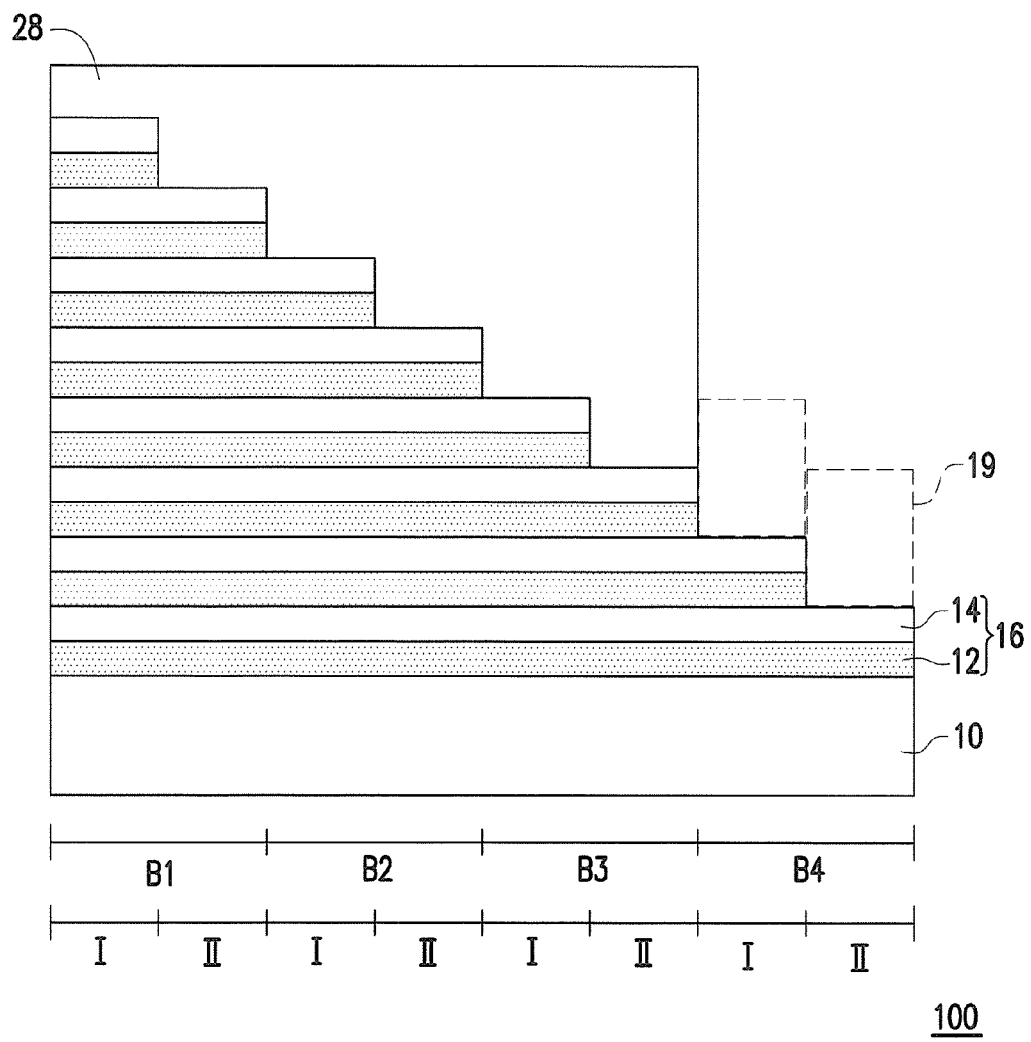

Referring to FIG. 1K and FIG. 1L, a photoresist layer 28 is formed on the staircase structure 104. In the present embodiment, the photoresist layer 28, for example, covers the composite layers 16 located on the blocks B1, B2 and B3. And, the number of the composite layers 16 covered by the photoresist layer 28 is, for example, two more than the number of the composite layers 16 covered by the photoresist layer 26 in FIG. 1H. Then, parts of the composite layers 16 not covered by the photoresist layer 28 are removed. The removing method includes the dry etching method. In one embodiment, the method for removing the parts of the composite layers 16 not covered by the photoresist layer 28 includes simultaneously removing two composite layers 16 (namely, the parts 19).

Figure 1M:
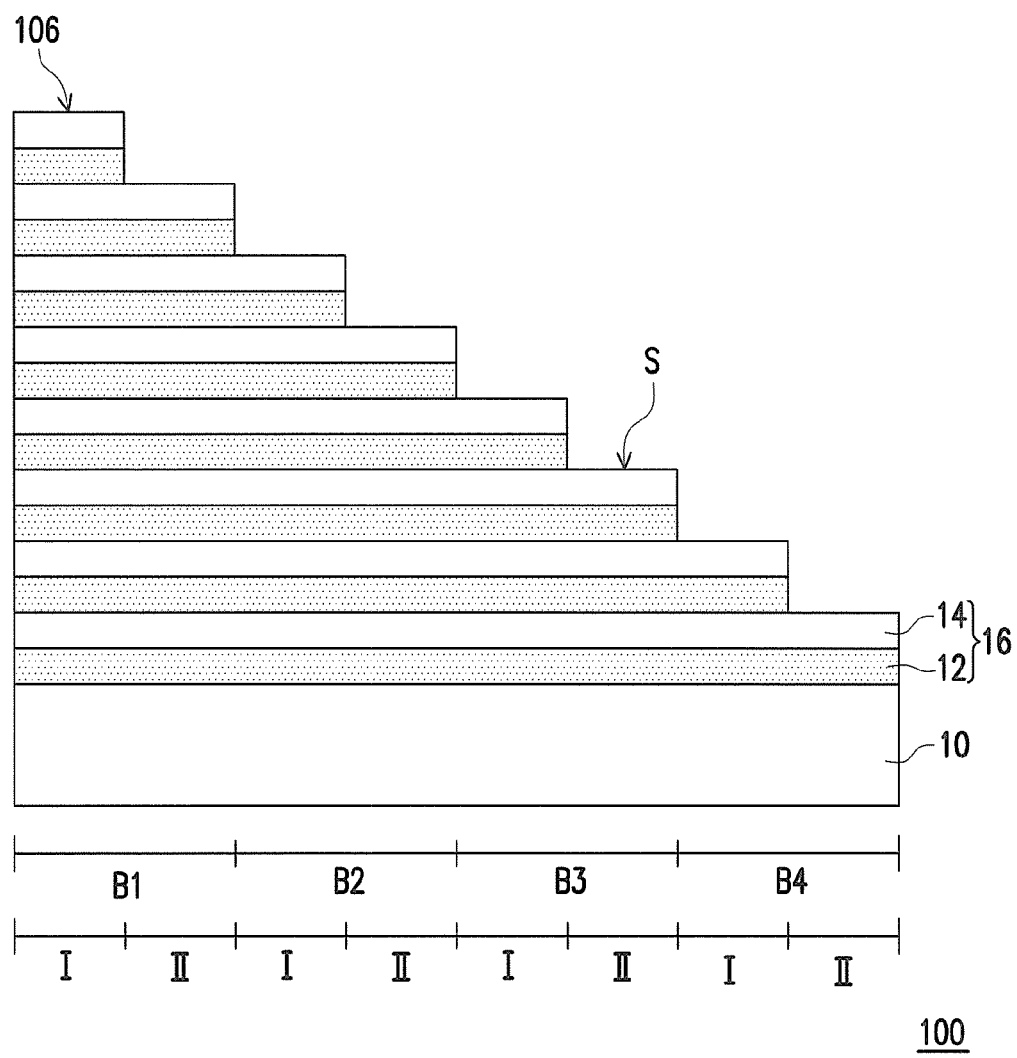

Referring to FIG. 1M, the photoresist layer 28 is removed, so as to form a staircase structure 106 on the substrate 10. The staircase structure 106 includes a plurality of stairs. For instance, the staircase structure 106 in FIG. 1M includes eight stairs. In one embodiment, a width of each of the stairs is, for example, equal to a width of the first region I of the substrate 10. Otherwise, the width of each of the stairs is, for example, equals to a width of the composite block 18. Moreover, the staircase structure 106, for example, includes a plurality of exposed surfaces S. In one embodiment, each of the exposed surfaces S exposes parts of the material layer 14 (e.g., the dielectric layer).

It is to be noted that, in the aforesaid method for the fabricating the semiconductor structure 100, the staircase structure 106 with eight stairs is, for example, formed by performing four times of the lithography and etching process.

The subsequent method for fabricating the semiconductor structure 100 includes forming a contact window (not shown) on the staircase structure 106, so that elements (e.g., memory cells) of each stairs located on the staircase structure 106 are electrically connected with other elements (e.g., word-lines, bit-lines, and etc). The subsequent methods for forming the contact window and other elements should be well known by those skilled in the art, and thus no further elaborated is to be provided herein.

In summary, in the method for fabricating the semiconductor structure of the invention, the pattern of the mask layer is transferred to the top-most layer of composite layers by pre-patterning the top-most layer of the composite layers. Then, in the subsequently performed lithography and etching process, the staircase structure is formed in a manner of using one photomask in combination with the etching of two composite layers. Therefore, when the number of the composite layers is N and N is an even number, the number of times being required to perform the lithography and etching process for forming the staircase structure with N stairs is N/2 times; and when N is an odd number, the number of times being required to perform the lithography and etching process for forming the staircase structure with N stairs is (N+1)/2 times. Consequently, as compared to the conventional fabrication process, the invention can greatly simplify the fabrication process of the staircase structure, thereby achieving the goals of lowering the manufacturing costs and enhancing the productivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating semiconductor structure, comprising:
    providing a substrate, the substrate comprising a plurality of blocks, each of the blocks respectively comprising a first region and a second region, the first region and the second region being disposed alternately;
    forming a plurality of composite layers on the substrate;
    patterning the top-most layer of the composite layers, so as to form a plurality of composite blocks on the first regions of the substrate; and
    successively removing the composite layers and the composite blocks on the blocks by a removal process, so as to form a staircase structure on the substrate, wherein a method for successively removing the composite layers and the composite blocks on the blocks by the removal process comprises:
        forming a photoresist layer on the substrate, the photoresist layer covering the composite layers and the composite blocks on one block;

removing the composite layers and the composite blocks not covered by the photoresist layer, so as to form the staircase structure on the substrate; and repeating the removal process, wherein for each repetition of the removal process, the photoresist layer further covers the composite layers on one more block.

2. The method for fabricating semiconductor structure as recited in claim 1, wherein the composite layers are N layers, and the number of times of performing the removal process is N/2−1, wherein N≥2 and N is an even number.

3. The method for fabricating semiconductor structure as recited in claim 1, wherein the composite layers are N layers, and the number of times of performing the removal process is (N+1)/2−1, wherein N≥2 and N is an odd number.

4. The method for fabricating semiconductor structure as recited in claim 1, wherein the number of the composite layers covered by the photoresist layer is two more than the number of the composite layers that are previously covered by the photoresist layer.

5. The method for fabricating semiconductor structure as recited in claim 1, wherein the method for removing the composite layers not covered by the photoresist layer comprises simultaneously removing two of the composite layers.

6. The method for fabricating semiconductor structure as recited in claim 1, wherein the method for removing the composite layers and the composite blocks not covered by the photoresist layer comprises simultaneously removing each of the composite blocks and the composite layer located under each of the composite blocks.

7. The method for fabricating semiconductor structure as recited in claim 1, wherein the method for forming the composite blocks on the first regions of the substrate comprises:

forming a mask layer on the composite layers of the first regions;

removing parts of the top-most layer of the composite layers not covered by the mask layer; and removing the mask layer, so as to form the composite blocks on the first regions of the substrate.

8. The method for fabricating semiconductor structure as recited in claim 1, wherein the composite layers are N layers, and the number of photomask required for performing the removal process is at least N/2−1, wherein N≥2 and N is an even number.

9. The method for fabricating semiconductor structure as recited in claim 1, wherein the composite layers are N layers, and the number of photomask required for performing the removal process is at least (N+1)/2−1, wherein N≥2 and N is an odd number.

10. The method for fabricating semiconductor structure as recited in claim 1, wherein the composite layers comprise a conductor layer, a semiconductor layer, a dielectric layer, or a combination thereof.

11. The method for fabricating semiconductor structure as recited in claim 1, wherein each of the composite layers comprises a conductor layer and a dielectric layer, and the conductor layers in two adjacent composite layers are electrically isolated by the dielectric layer.

12. The method for fabricating semiconductor structure as recited in claim 11, wherein the staircase structure comprises a plurality of exposed surfaces, and each of the exposed surfaces exposes a part of the dielectric layer.

13. The method for fabricating semiconductor structure as recited in claim 1, wherein the staircase structure comprises a plurality of stairs, and a width of each of the stairs is equal to a width of each of the first regions of the substrate.

* * * * *